(12) United States Patent
Zhang et al.

(10) Patent No.: US 11,114,506 B2
(45) Date of Patent: Sep. 7, 2021

(54) ORGANIC LIGHT EMITTING DISPLAY PANEL, DISPLAY DEVICE AND MANUFACTURING METHOD THEREOF

(71) Applicant: BOE Technology Group Co., Ltd., Beijing (CN)

(72) Inventors: Can Zhang, Beijing (CN); Can Wang, Beijing (CN); Xiaochuan Chen, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/648,729

(22) PCT Filed: Sep. 5, 2019

(86) PCT No.: PCT/CN2019/104515
§ 371 (c)(1),
(2) Date: Mar. 19, 2020

(87) PCT Pub. No.: WO2020/063291
PCT Pub. Date: Apr. 2, 2020

(65) Prior Publication Data
US 2021/0225949 A1    Jul. 22, 2021

(30) Foreign Application Priority Data
Sep. 25, 2018    (CN) .......................... 201811119672.9

(51) Int. Cl.
*H01L 27/32* (2006.01)
*H01L 51/52* (2006.01)
(Continued)

(52) U.S. Cl.
CPC ...... *H01L 27/3206* (2013.01); *H01L 51/0037* (2013.01); *H01L 51/5215* (2013.01);
(Continued)

(58) Field of Classification Search
CPC . H01L 27/3206; H01L 51/56; H01L 51/5265; H01L 51/5218
See application file for complete search history.

(56) References Cited

U.S. PATENT DOCUMENTS

| 2005/0225232 A1 | 10/2005 | Boroson et al. |
| 2014/0203271 A1 | 7/2014 | Yoneda et al. |
| 2014/0332779 A1 | 11/2014 | Lin |

FOREIGN PATENT DOCUMENTS

| CN | 104143559 A | 11/2014 |
| CN | 106981504 A | 7/2017 |

(Continued)

OTHER PUBLICATIONS

Chinese Office Action for 201811119672.9 dated Mar. 4, 2020.
Chinese Office Action for 201811119672.9 dated May 12, 2020.

*Primary Examiner* — Anthony Ho
(74) *Attorney, Agent, or Firm* — Arent Fox LLP; Michael Fainberg

(57) ABSTRACT

The present application discloses an organic light emitting display panel, a display device and a manufacturing method thereof. The organic light emitting display substrate includes: a reflecting layer disposed on a substrate and a blocking layer disposed on the reflecting layer, where the blocking layer includes retaining walls configured to separate each pixel unit, and a transparent conducting layer, a first electrode, a light emitting layer and a second electrode which is semi-transparent and semi-reflective are arranged in sequence on a side, facing away from the substrate, of the reflecting layer within each pixel unit defined by retaining walls; in a direction vertical to the substrate, the thicknesses of the transparent conducting layers of pixel units with different emitting colors are different, such that the light (Continued)

emitted by each pixel unit is transmitted between the reflecting layer and the second electrode to satisfy the strong microcavity effect.

18 Claims, 4 Drawing Sheets

(51) Int. Cl.
    *H01L 51/56*         (2006.01)
    *H01L 51/00*         (2006.01)
    *H01L 51/50*         (2006.01)

(52) U.S. Cl.
    CPC ...... *H01L 51/5218* (2013.01); *H01L 51/5265* (2013.01); *H01L 51/56* (2013.01); *H01L 27/322* (2013.01); *H01L 27/3246* (2013.01); *H01L 51/0096* (2013.01); *H01L 51/5044* (2013.01)

(56) References Cited

FOREIGN PATENT DOCUMENTS

| | | |
|---|---|---|
| CN | 107195584 A | 9/2017 |
| CN | 107275503 A | 10/2017 |
| CN | 108288636 A | 7/2018 |
| CN | 109103236 A | 12/2018 |
| KR | 20140066607 A | 6/2014 |

ORGANIC LIGHT EMITTING DISPLAY PANEL, DISPLAY DEVICE AND MANUFACTURING METHOD THEREOF

CROSS REFERENCE

The present application is a US National Stage of International Application No. PCT/CN2019/104515, filed on Sep. 5, 2019, which claims the priority of Chinese patent application No. 201811119672.9, filed with Chinese Patent Office on Sep. 25, 2018, and entitled "Organic Light Emitting Display Substrate, Display Device and Manufacturing Method Thereof", the contents of which are incorporated by reference herein in its entirety.

FIELD

The present disclosure relates to the technical field of semiconductors, in particular to an organic light emitting display substrate, a display device and a manufacturing method thereof.

BACKGROUND

Micro OLEDs are widely used, among which silicon-based micro OLEDs possess excellent display characteristics. Owing to its high brightness, rich colors, low driving voltage, high response speed and low power consumption, the silicon-based micro OLED has a very good user experience. As an all-solid state device, the silicon-based micro OLED has a favorable anti-seismic performance and a wide range of working temperatures (−40° C.-85° C.), and is suitable for military and special applications. The silicon-based micro OLED also belongs to a self-luminous device, does not need a backlight, and has a wide range of viewing angle and a small thickness, thereby being beneficial for reducing system volume and being especially suitable for near-eye display systems.

For the future augmented reality (AR) display technology, as required by the display screen, the most important product index are brightness and PPI, since AR products need to adjust their own screen brightness in different working environments and scenarios, to achieve sensory experience suitable to human eyes. Especially in a mode in which AR products are directly facing to the sun outdoors, the device brightness needs to be improved.

In the prior art, when the OLED is applied as a micro display, due to the limitation of a fine metal mask (FMM), a manner using white light and color film is adopted, while the full color form of white light and color film limits the advantage of higher color gamut of the OLED itself, and the color gamut of the OLED is about 80%, while the color gamut of the real RGB is greater than 100. That is, when the OLED in the prior art is used as a micro display, a higher color gamut and a higher brightness are difficult to obtain.

SUMMARY

The present disclosure provides an organic light emitting display substrate, a display device and a manufacturing method thereof, to solve the problem that higher color gamut and higher brightness are difficult to obtain when an OLED is used as a micro display in the prior art.

An embodiment of the present disclosure provides an organic light emitting display substrate, including: a reflecting layer disposed on a substrate and a blocking layer disposed on the reflecting layer, where the blocking layer includes retaining walls configured to separate each pixel unit, and within each pixel unit defined by retaining walls, a transparent conducting layer, a first electrode, a light emitting layer and a second electrode which is semi-transparent and semi-reflective are arranged in that order on a side, facing away from the substrate, of the reflecting layer;

in a direction vertical to the substrate, the thicknesses of the transparent conducting layers of pixel units with different emitting colors are different, such that the light emitted by each pixel unit is transmitted between the reflecting layer and the second electrode to satisfy the strong microcavity effect.

In a possible embodiment, in the direction vertical to the substrate, the heights of the retaining walls of each pixel unit are greater than or equal to the thickness of the transparent conducting layer of the pixel unit.

In a possible embodiment, the pixel unit includes a red pixel unit, a green pixel unit and a blue pixel unit, and the thicknesses of the transparent conducting layers within the red pixel unit, the green pixel unit and the blue pixel unit are decreased in sequence.

In a possible embodiment, the heights of the retaining walls of each pixel unit are the same, and are all equal to a sum of the thickness of the transparent conducting layer of the red pixel unit and a preset value, wherein the preset value is 200 Å-500 Å.

In a possible embodiment, the material of the transparent conducting layer includes a transparent conductive organic composite film.

In a possible embodiment, the transparent conductive organic composite film includes composite ink of poly(3,4-ethylenedioxythiophene)/poly(4-styrenesulfonic acid).

In a possible embodiment, the light emitted by the light emitting layer of each pixel unit is white light, and a color film layer is further disposed on a side, facing away from the substrate, of the second electrode.

In a possible embodiment, the light emitting layer includes a hole injection layer, a hole transporting layer, a red light emitting layer, a green light emitting layer, a charge generating layer, a blue light emitting layer, an electron transporting layer and an electron injection layer which are arranged in sequence on a side, facing away from the substrate, of the first electrode.

In a possible embodiment, the substrate includes a silicon-based substrate.

In a possible embodiment, the reflecting layer is an insulating layer, and the reflecting layer is provided with via holes which correspond to the positions of respective pixel units;

the organic light emitting display substrate further includes a thin film transistor array which drives each pixel unit to emit light, the thin film transistor array is arranged between the substrate and the reflecting layer, and each thin film transistor is connected with the transparent conducting layer of the pixel unit driven by the thin film transistor through the via hole which correspond to the position of each pixel unit.

In a possible embodiment, the reflecting layer is a conductive film layer and includes a plurality of reflecting electrodes arranged at intervals, where each of reflecting electrodes is in a one-to-one correspondence relationship with a pixel unit, adjacent reflecting electrodes are separated through a retaining wall which is the retaining wall between adjacent pixel units corresponding to adjacent reflecting electrodes.

In a possible embodiment, the material of the reflecting layer includes aluminum.

In a possible embodiment, the first electrode is an anode layer, and the second electrode is a cathode layer.

An embodiment of the present disclosure further provides a display device which includes the organic light emitting display substrate provided in an embodiment of the present disclosure.

An embodiment of the present disclosure further provides a manufacturing method of the organic light emitting display substrate provided in an embodiment of the present disclosure, wherein the manufacturing method includes:

forming a reflecting layer on the substrate;

forming retaining walls for separating each pixel unit on the reflecting layer;

printing a corresponding amount of transparent conductive liquid within the pixel unit defined by retaining walls through a manner of printing, where the film layer formed by the transparent conductive liquid is taken as a transparent conducting layer; and forming in sequence a first electrode, a light emitting layer and a second electrode which is semi-transparent and semi-reflective on the transparent conducting layer.

In a possible embodiment, the step of forming retaining walls for separating each pixel unit on the reflecting layer specifically includes: forming the retaining walls on the reflecting layer through a photolithographic process, where the height of the retaining wall in the direction vertical to the substrate is equal to a sum of the thickness of the transparent conducting layer of the red pixel unit and a preset value, and the preset value is 200 Å-500 Å.

In a possible embodiment, the step of printing a corresponding amount of transparent conductive liquid within the pixel unit defined by retaining walls through a manner of printing specifically includes:

calculating the number of drops of the transparent conductive liquid which is to be printed to each pixel unit according to the thickness of the to-be-formed transparent conducting layer of each pixel unit; and printing a corresponding number of drops of the transparent conductive liquid within the pixel unit defined by retaining walls through a manner of printing.

In a possible embodiment, the step of printing a corresponding number of drops of the transparent conductive liquid within the pixel unit defined by retaining walls specifically includes:

printing a corresponding number of drops of composite ink of poly(3,4-ethylenedioxythiophene)/poly(4-styrenesulfonic acid) within the pixel unit defined by retaining walls.

DETAILED DESCRIPTION OF THE EMBODIMENTS

In order to make the objectives, technical solutions, and advantages of the embodiments of the present disclosure clearer, the technical solutions of the embodiments of the present disclosure will be described below clearly and completely in combination with accompanying drawings of the present disclosure. Apparently, the embodiments described below are only a part but not all of the embodiments of the present disclosure. Based upon the described embodiments of the present disclosure, all of the other embodiments obtained by those skilled in the art without any creative effort shall all fall into the protection scope of the present disclosure.

Unless otherwise defined, the technical or scientific terms used in the present disclosure shall have a general meaning understood by those skilled in the art to which the present disclosure belongs. The terms "first", "second" and the like used in the present disclosure do not indicate any order, quantity, or importance, but are only used to distinguish different components. Words like "include" or "contain" mean that the element or object preceding the word covers the element or object listed after the word and its equivalent, without excluding other elements or objects. Words like "connection" or "connected" are not limited to physical or mechanical connections, but can include electrical connections, whether direct or indirect connections. "Upper", "lower", "left", "right" and so on are only used to represent relative position relationships. When the absolute position of the described object is changed, the relative position relationship may also be changed correspondingly.

In order to keep the following description of embodiments of the present disclosure clear and concise, detailed description of known functions and known components is omitted in the present disclosure.

Figure 1:
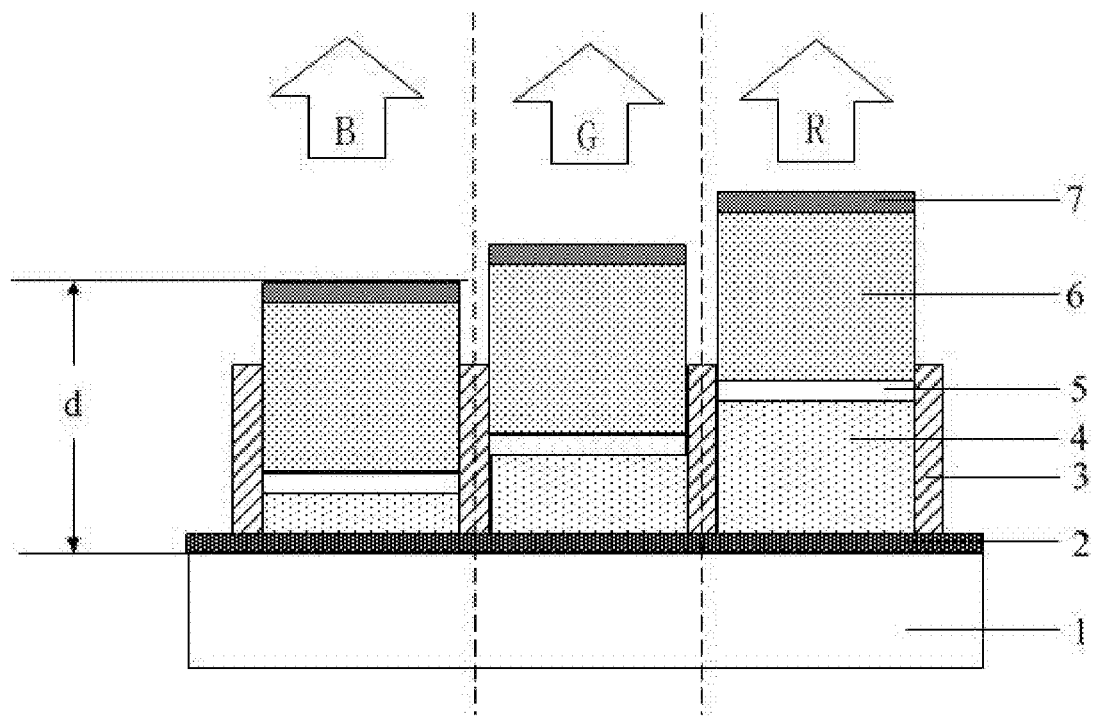
FIG. 1 is a structural schematic diagram of an organic light emitting display substrate provided in an embodiment of the present disclosure.
Figure 3:
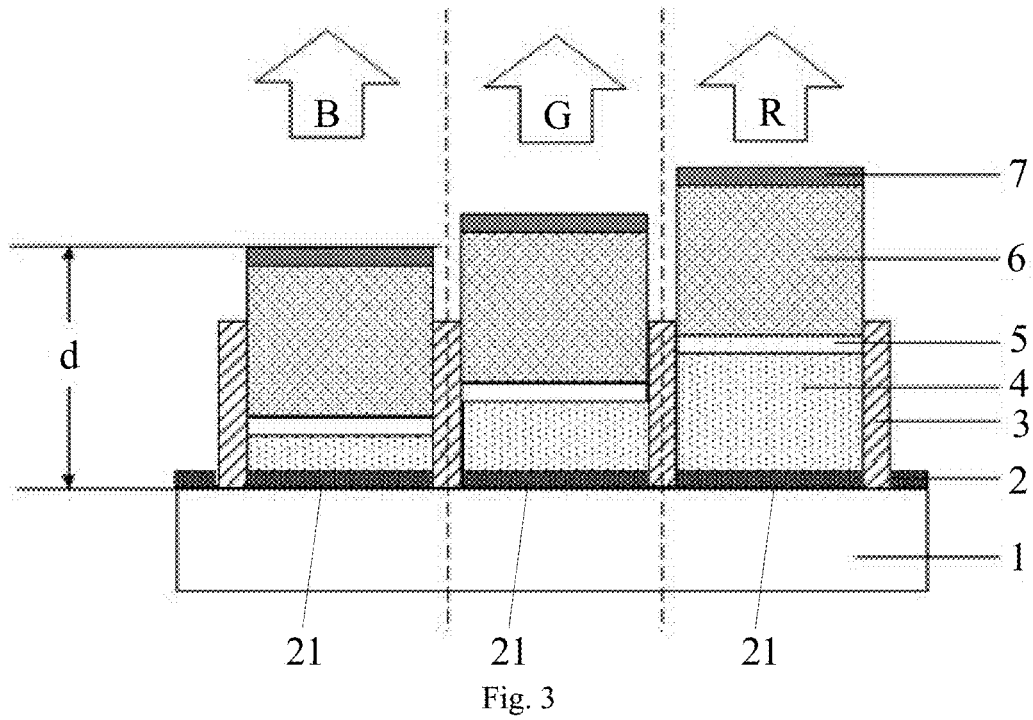
FIG. 3 is a structural schematic diagram of an organic light emitting display substrate provided in another embodiment of the present disclosure.

Please refer to FIG. 1 and FIG. 3. An embodiment of the present disclosure provides an organic light emitting display substrate, including: a reflecting layer 2 disposed on a substrate 1 and a blocking layer disposed on the reflecting layer 2, where the blocking layer includes retaining walls 3 configured to separate each pixel unit, and in each pixel unit defined by retaining walls 3, a transparent conducting layer 4, a first electrode 5, a light emitting layer 6 and a second electrode 7 which is semi-transparent and semi-reflective are arranged in that order on a side of the reflecting layer facing away from the substrate 1;

in a direction vertical to the substrate 1, the thicknesses of the transparent conducting layers 4 of pixel units with different emitting colors are different, such that the light emitted by each pixel unit is transmitted between the reflecting layer 2 and the second electrode 7 to achieve the strong microcavity effect.

As to the organic light emitting display substrate provided in an embodiment of the present disclosure, each pixel unit can form a microcavity structure between the reflecting layer 2 and the second electrode 7 which is semi-transparent and semi-reflective. Since the thicknesses of the transparent conducting layers 4 of pixel units with different emitting colors are different, while the thicknesses of other film layers of each pixel unit are almost the same (that is, the thicknesses of the first electrode 5 and the light emitting layer 6 of each pixel unit are almost the same), through adjusting the thicknesses of the transparent conducting layers 4 of the pixel units with different emitting colors, the pixel units with different emitting colors can be enabled to form microcavity structures with different cavity lengths of d between the reflecting layer 2 and the second electrode 7, and further the light emitting intensity and the color gamut of the pixel units with different emitting colors are enabled to reach the maximum values. When used as a micro display, a higher color gamut and a higher brightness can be obtained. Moreover, if an insulating layer is taken as an optical adjustment layer (that is, a film layer between the first electrode 5 and the reflecting layer 2), optical adjustment layers of different thicknesses need to be formed in the pixel units with different emitting colors through an etching process for multiple times, and via holes for communicating the first electrode 5 with the reflecting layer 2 need to be formed through a hole digging process. Compared with the above manner, in an embodiment of the present disclosure, a blocking layer is firstly formed on the reflecting layer 2, while the blocking layer includes multiple retaining walls 3 which are configured to separate each pixel unit, and further subsequently, transparent conducting layers 4 with different thicknesses can be printed in the pixel unit formed through separation by retaining walls 3 through a manner of printing, that is, the manufacturing process of forming optical adjustment layers with different thicknesses on the pixel units with different emitting colors can be greatly simplified, and the manufacturing cost is also lower. Moreover, the optical adjustment layer is a transparent conducting layer 4, and no via hole for communicating the reflecting layer 2 with the first electrode 5 needs to be formed, thereby further simplifying the manufacturing process.

In an embodiment of the present disclosure, a microcavity structure can be formed between the second electrode 7 which is semi-transparent and semi-reflective and a reflecting layer 2 of each pixel unit, such that the display panel can form a device with a strong microcavity effect. Due to the strong reflection effect of the reflecting layer 2, the directly-emitted light beam and the light beam reflected by the reflecting layer 2 are mutually interfered, such that the device with a strong microcavity effect can narrow the luminescence spectrum of electroluminescence, and further improves color purity and increases color gamut of the display panel. Since interference occurs and the intensity of electroluminescence is enhanced, the brightness of the display panel is improved.

When a strong microcavity effect occurs, $\delta = 2j(\lambda/2) = 2nd \cos\theta$ should be satisfied, where j is an integer, $\lambda$ is the wavelength of emitted light, n is an average refractive index of the medium in the microcavity, d is a cavity length of the microcavity, and $\theta$ is a reflection angle. It can be seen from the above formula of microcavity optical path difference that, the cavity length d of the microcavity is proportional to the wavelength $\lambda$ of emitted light, therefore, the cavity length of the microcavity is increased along with an increase of wavelength of emitted light which corresponds to the pixel unit. Moreover, since the wavelength of light is also corresponding to the color of light, the cavity length of the microcavity required by the pixel units with different emitting colors when a strong microcavity effect occurs can be further obtained. During specific implementation, the cavity length of the microcavity can be set according to actual requirements, and the cavity length of the microcavity is not limited herein. Specifically, the cavity length of the microcavity required for different emitting colors when a strong microcavity effect is formed is calculated through optical simulation, and after the thicknesses of the first electrode 5 and the light emitting layer 6 are removed, the thicknesses of the transparent conducting layers 4 corresponding to pixel units with different emitting colors can be obtained. During specific implementation, the thicknesses of the first electrodes 5 of each pixel unit can be set to be the same, and the thicknesses of the light emitting layers 6 are all the same. In addition, if enhanced interference is expected and the light emitting of the device is expected to be optimized, the position of the light emitting body should satisfy that the phase change of the round optical path between the light emitting body and the reflecting electrode is an integral multiple of $2\pi$.

During specific implementation, as shown in FIG. 1 and FIG. 3, in the direction vertical to the substrate 1, the heights of the retaining walls 3 of each pixel unit are all greater than or equal to the thickness of the transparent conducting layer 4 of the pixel unit. In an embodiment of the present disclosure, the heights of the retaining walls 3 of each pixel unit are all greater than or equal to the thickness of the transparent conducting layer 4 of the pixel unit. Further, when a transparent conductive liquid is printed through a printing manner within the pixel unit defined by retaining walls, the transparent conductive liquid of each pixel unit can be ensured to be located within the range defined by the retaining walls 3, and further transparent conducting layers 4 of different thicknesses can be formed within the pixel units with different emitting colors.

In a possible embodiment, the pixel unit includes a red pixel unit, a green pixel unit and a blue pixel unit, and the thicknesses of the transparent conducting layers within the red pixel unit, the green pixel unit and the blue pixel unit are decreased in sequence, such that a strong microcavity effect is formed in the pixel unit with each emitting color.

Figure 2:
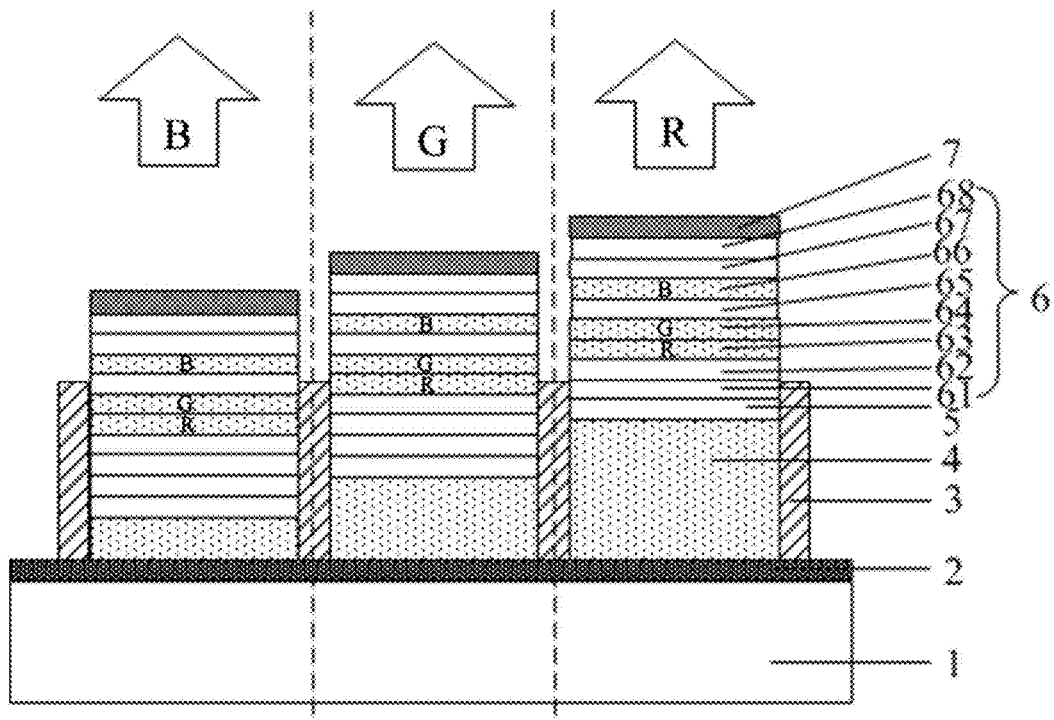
FIG. 2 is a structural schematic diagram of a particular organic light emitting display substrate provided in an embodiment of the present disclosure.

Further, the heights of the retaining walls 3 of respective pixel unit are the same, and are all equal to a sum of the thickness of the transparent conducting layer 4 of the red pixel unit and a preset value, wherein the preset value is 200 Å-500 Å. Exemplarily, as shown in FIG. 2, the light emitted by the light emitting layer 6 of each pixel unit is white light. The light emitting layer 6 can include a hole injection layer 61, a hole transporting layer 62, a red light emitting layer 63, a green light emitting layer 64, a charge generating layer 65, a blue light emitting layer 66, an electron transporting layer 67 and an electron injection layer 68 which are arranged in sequence on a first electrode 5. For example, according to simulated results, the cavity length of the blue pixel unit is 1950 Å, the cavity length of the green pixel unit is 2250 Å, and the cavity length of the red pixel unit is 2550 Å, where the thickness of the first electrode 5 is 200 Å, the thickness of the hole injection layer 61 is 100 Å, the thickness of the hole transporting layer 62 is 200 Å, the thickness of the red light emitting layer 63 is 100 Å, the thickness of the green light emitting layer 64 is 300 Å, the thickness of the charge generating layer 65 is 150 Å, the thickness of the blue light emitting layer 66 is 250 Å, the thickness of the electron transporting layer 67 is 200 Å, and the thickness of the electron injection layer 68 is 300 Å. Then the thickness of the transparent conducting layer 4 required by the red pixel unit is obtained by subtracting the thicknesses of the first electrode 5 and the light emitting layer 6 from the cavity length of the red pixel unit, and is 750 Å, and the required thickness of the retaining wall 3 is greater than or equal to 750 Å, and can be specifically 1 µm. In an embodiment of the present disclosure, the heights of retaining walls 3 of respective pixel unit are the same, thereby simplifying the process in manufacturing blocking layers. The heights of the retaining walls 3 are all equal to the sum of the thickness of a transparent conducting layer 4 of a red pixel unit and a preset value, that is, since the cavity length of the microcavity structure corresponding to the red pixel unit is the longest, the thickness of the transparent conducting layer 4 is the biggest, the height of the retaining wall 3 is set to be equivalent to the thickness of the pixel unit, having the biggest thickness, of the transparent conducting layer 4, and further during printing, the limit of printing liquid of other pixel units can also be satisfied. The heights of the retaining walls 3 are all equal to the sum of the thickness of the transparent conducting layer 4 of the red pixel unit and a preset value, so that transparent conductive liquid can be possibly prevented from spilling out of an area defined by the retaining walls 3 during printing if the height of the retaining wall 3 is completely identical to the thickness of the transparent conducting layer 4.

In a possible embodiment, the material of the transparent conducting layer 4 is a transparent conductive organic composite film. Specifically, the transparent conductive organic composite film can be composite ink of poly(3,4-ethylenedioxythiophene)/poly(4-styrenesulfonic acid). In an embodiment of the present disclosure, the material of the transparent conducting layer 4 is composite ink of poly(3,4-ethylenedioxythiophene)/poly(4-styrenesulfonic acid) (PEDOT/PSS), such that the light, with a wavelength of 550 nm, has a transmittance of greater than 85%, thereby being beneficial for improving color gamut and brightness of emitted light. When the transparent conducting layer 4 is formed, a method of solution processing can be specifically adopted. Of course, the material of the transparent conducting layer 4 is not limited to this type, and can also be other transparent organic composite films which can be conductive.

In a possible embodiment, the light emitted by the light emitting layer 6 of each pixel unit is white light, and the second electrode 7 is further provided with a color film layer thereon, which is not shown in FIG. 2.

In a possible embodiment, the substrate 1 is a silicon-based substrate.

During specific implementation, the reflecting layer 2 in an embodiment of the present disclosure can be specifically a whole insulating film layer. As shown in FIG. 1 and FIG. 2, a thin film transistor configured to drive the pixel unit to emit light is also arranged between the substrate 1 and the reflecting layer 2, and the light emitting device above the reflecting layer 2 can be communicated with the thin film transistor below the reflecting layer 2 through a hole digging manner. Specifically, the reflecting layer 2 is provided with via holes which correspond to the positions of respective pixel units; and each thin film transistor is connected with the transparent conducting layer 4 of the pixel unit driven by the thin film transistor through via hole which correspond to the pixel unit.

Or, as shown in FIG. 3, the reflecting layer 2 can also specifically be a conductive film layer. When the reflecting layer 2 is a conductive film layer, the reflecting layer 2 can specifically include multiple reflecting electrodes 21 which are set at intervals, each reflecting electrode 21 is in a one-to-one correspondence relationship with a pixel unit, adjacent reflecting electrodes 21 can be separated through a retaining wall 3, and the retaining wall 3 is the retaining wall 3 between adjacent pixel units corresponding to adjacent reflecting electrodes 21. At this time, the blocking layer above the reflecting layer 2 can specifically mean that part of the blocking layer is arranged above the reflecting layer 2; specifically, a thin film transistor which drives the pixel unit to emit light can also be arranged between the substrate 1 and the reflecting layer 2, and each thin film transistor is directly connected with a transparent conducting layer 4 of the pixel unit driven by the thin film transistor through a reflecting electrode 21. Optionally, the material of the reflecting layer 2 can be metal, and specifically can be aluminum.

In a possible embodiment, the first electrode 5 is an anode layer, and the second electrode 7 is a cathode layer. Specifically, the first electrode 5 can be transparent indium tin oxide.

Based on the same disclosure concept, an embodiment of the present disclosure further provides a display device, including an organic light emitting display substrate as provided in an embodiment of the present disclosure.

Figure 4:
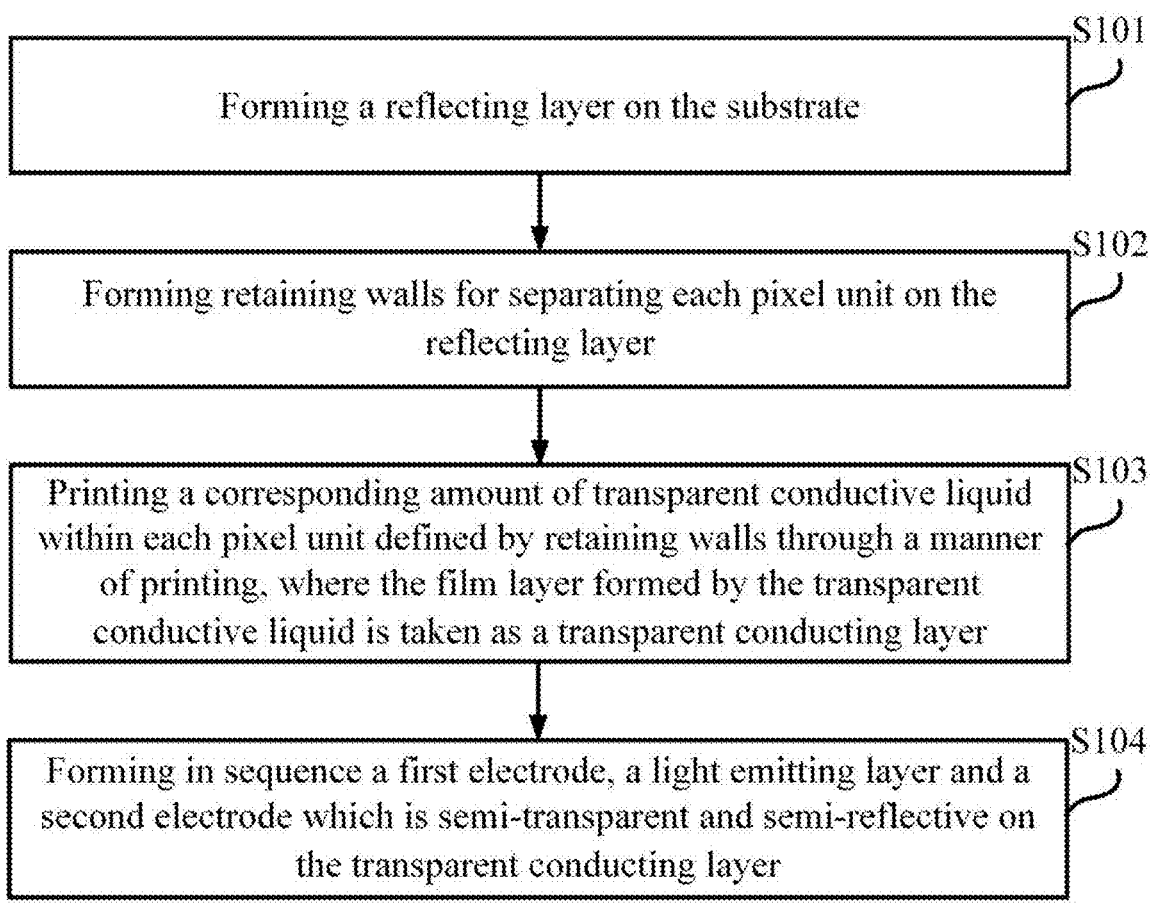
FIG. 4 is a diagram of manufacturing flows of an organic light emitting display substrate provided in an embodiment of the present disclosure.

Based on the same disclosed concept, an embodiment of the present disclosure further provides a manufacturing method of an organic light emitting display substrate as provided in an embodiment of the present disclosure. As shown in FIG. 4, the manufacturing method includes:

Step S101, forming a reflecting layer on the substrate.

Step S102, forming retaining walls for separating each pixel unit on the reflecting layer.

Specifically, retaining walls with a preset height value is formed on the reflecting layer through a photolithographic process, where the preset height value is equal to the sum of the thickness of a transparent conducting layer of the red pixel unit and a preset value, and the preset value is 200 Å-500 Å.

Step S103, printing a corresponding amount of transparent conductive liquid within each pixel unit defined by retaining walls through a manner of printing, where the film layer formed by the transparent conductive liquid is taken as a transparent conducting layer.

Step S104, forming in sequence a first electrode, a light emitting layer and a second electrode which is semi-transparent and semi-reflective on the transparent conducting layer.

Figure 5:
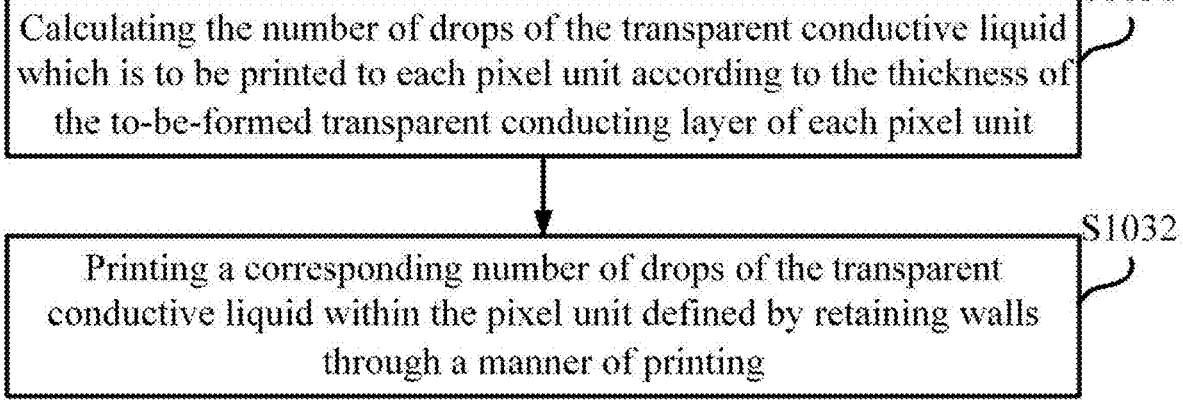
FIG. 5 is a diagram of manufacturing flows for forming a transparent conducting layer provided in an embodiment of the present disclosure.

During specific implementation, as to step S103, as shown in FIG. 5, the step of printing a corresponding amount of transparent conductive liquid within each pixel unit defined by retaining walls through a manner of printing can specifically include:

Step S1031, calculating the number of drops of the transparent conductive liquid which is to be printed to each pixel unit according to the thickness of the to-be-formed transparent conducting layer of each pixel unit; and Step S1032, printing a corresponding number of drops of the transparent conductive liquid within the pixel unit defined by retaining walls through a manner of printing.

While the step of printing a corresponding number of drops of the transparent conductive liquid within the pixel unit defined by retaining walls in step S1032 specifically includes: printing a corresponding number of drops of composite ink of poly(3,4-ethylenedioxythiophene)/poly(4-styrenesulfonic acid) within the pixel unit defined by retaining walls.

In order to more clearly understand the manufacturing method of an organic display panel provided in an embodiment of the present disclosure, a brief description will be given below with examples in combination with FIG. 4 to FIG. 8.

Step 1, manufacturing a silicon-based substrate 1 (wafer), here the manufacturing process can be the same as the manufacturing process in the prior art.

Figure 6:
FIG. 6 is a structural schematic diagram of a display substrate after a reflecting layer is manufactured in an embodiment of the present disclosure.

Step 2, forming a reflecting layer 2 on the silicon-based substrate 1, as shown in FIG. 6.

Figure 7:
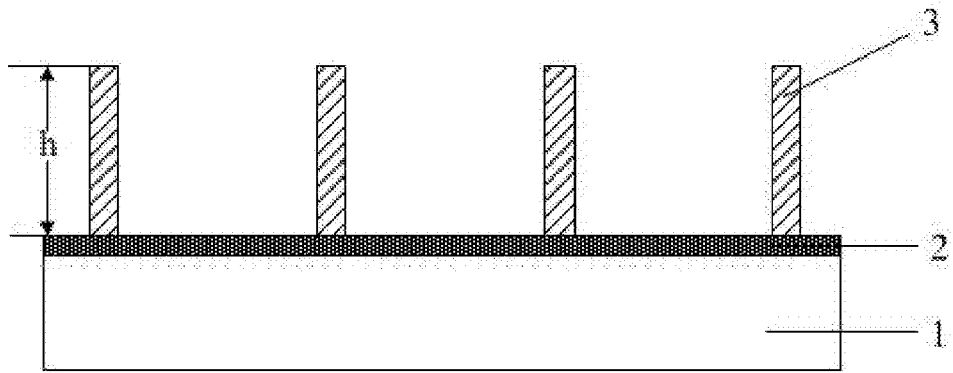
FIG. 7 is a structural schematic diagram of an organic light emitting display substrate after a blocking layer is manufactured in an embodiment of the present disclosure.

Step 3, manufacturing a blocking layer on the reflecting layer 2 according to the size of pixels to be formed subsequently, where the blocking layer includes multiple retaining walls 3, as shown in FIG. 7, the thickness h of the blocking layer in the direction vertical to the substrate needs to be determined according to the pixel with the longest cavity length in R, G and B, if the cavity length of the red pixel unit is the longest, then the thickness of the blocking layer is designed according to the thickness of the red pixel unit. For example, according to simulated results, the cavity length of the blue pixel unit is 1950 Å, the cavity length of the green pixel unit is 2250 Å, and the cavity length of the red pixel unit is 2550 Å, then the thickness of the transparent conducting layer required by the red pixel unit is 750 Å, and then the required thickness of the blocking layer is greater than or equal to 750 Å. Specifically, the thickness of the blocking layer can be set to 1 μm.

Step 4, calculating the number of drops of the transparent conductive liquid which is to be printed to each pixel unit according to the thickness of the to-be-formed transparent conducting layer 4 of each pixel unit. For example, the thickness of a transparent conducting layer required to be formed in a blue pixel unit is 150 Å, 3 drops of transparent conductive liquid need to be dripped through calculation according to the printing head and the area of the pixel unit defined by retaining walls 3. The thickness of the transparent conducting layer required to be formed in the green pixel unit is 450 Å, and 9 drops need to be dripped. The thickness of the transparent conducting layer required to be formed in the red pixel unit is 750 Å, and 15 drops need to be dripped.

Figure 8:
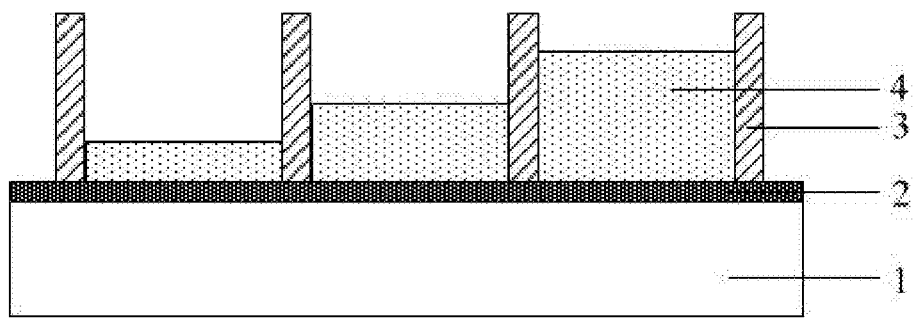
FIG. 8 is a structural schematic diagram of an organic light emitting display substrate after a transparent conducting layer is manufactured in an embodiment of the present disclosure.

Step 5, printing a corresponding number of drops of transparent conductive liquid within the pixel unit defined by retaining walls 3 through a manner of printing, and taking the film layer formed by the transparent conductive liquid as a transparent conducting layer 4, as shown in FIG. 8. Where the transparent conductive liquid can be specifically composite ink of poly(3,4-ethylenedioxythiophene)/poly(4-styrenesulfonic acid) (PEDOT/PSS).

Step 6, depositing and patterning an ITO on a transparent conducting layer 4 to form a first electrode 5, and manufacturing in sequence a light emitting layer 6 and a second electrode 7 which is semi-transparent and semi-reflective on the ITO to complete the device structure, as shown in FIG. 1.

An embodiment of the present disclosure has the following beneficial effects: as to the organic light emitting display substrate provided in an embodiment of the present disclosure, each pixel unit can form a microcavity structure between the reflecting layer and the second electrode which is semi-transparent and semi-reflective. Since the thicknesses of the transparent conducting layers of pixel units with different emitting colors are different, while the thicknesses of other film layers of each pixel unit are basically the same (that is, the thicknesses of the first electrode and the light emitting layer of each pixel unit are basically the same), through adjusting the thicknesses of the transparent conducting layers of the pixel units with different emitting colors, the pixel units with different emitting colors can be enabled to form different microcavity structures with different cavity lengths between the reflecting layer and the second electrode, and further the light emitting intensity and color gamut of the pixel units with different emitting colors are enabled to be optimal. Moreover, if an insulating layer is taken as an optical adjustment layer (that is, a film layer between the first electrode and the reflecting layer), optical adjustment layers of different thicknesses need to be formed on the pixel units with different emitting colors through an etching process for multiple times, and via holes for communicating the first electrode with the reflecting layer need to be formed through a hole digging process. Compared with the above manner, in an embodiment of the present disclosure, a blocking layer is firstly formed on the reflecting layer, while the blocking layer includes multiple retaining walls which are configured to separate each pixel unit, and further subsequently, transparent conducting layers with different thicknesses can be printed within the pixel unit formed through separation by retaining walls through a manner of printing, that is, the manufacturing process of forming optical adjustment layers with different thicknesses on the pixel units with different emitting colors can be greatly simplified, and the manufacturing cost is also lower. Moreover, the optical adjustment layer is a transparent conducting layer, and no via hole for communicating the reflecting layer with the first electrode needs to be formed, thereby further simplifying the manufacturing process.

Evidently, those skilled in the art can make various modifications and variations to the present disclosure without departing from the spirit and scope of the present disclosure. Accordingly, the present disclosure is also intended to encompass these modifications and variations thereto so long as the modifications and variations come into the scope of the claims appended to the disclosure and their equivalents.

The invention claimed is:

1. An organic light emitting display panel, comprising: a substrate, a reflecting layer, a blocking layer and a plurality of pixel units, wherein the reflecting layer is disposed on a substrate;

the blocking layer is disposed on the reflecting layer, and the blocking layer comprises retaining walls configured to separate the plurality of pixel unit; and each of the plurality of pixel units defined by retaining walls comprises a transparent conducting layer, a first electrode, a light emitting layer and a second electrode arranged in that order on a side of the reflecting layer facing away from the substrate, wherein the second electrode is semi-transparent and semi-reflective;

wherein light emitted by each of the plurality of pixel units is transmitted between the reflecting layer and the second electrode in such a way that light propagation satisfies the strong microcavity effect, and in a direction vertical to the substrate, thicknesses of transparent conducting layers in the plurality of pixel units with different emitting colors are different.

2. The organic light emitting display panel of claim 1, wherein in the direction vertical to the substrate, heights of the retaining walls of each of the plurality of pixel units are all greater than or equal to the thickness of the transparent conducting layer of the pixel unit.

3. The organic light emitting display panel of claim 2, wherein the plurality of pixel units comprises a red pixel unit, a green pixel unit and a blue pixel unit, and thicknesses of transparent conducting layers within the red pixel unit, the green pixel unit and the blue pixel unit are decreased in sequence.

4. The organic light emitting display panel of claim 3, wherein the heights of the retaining walls of each of the plurality of pixel units are the same, and are all equal to a sum of the thickness of the transparent conducting layer of the red pixel unit and a preset value, wherein the preset value is 200 Å-500 Å.

5. The organic light emitting display panel of claim 1, wherein a material of the transparent conducting layer comprises a transparent conductive organic composite film.

6. The organic light emitting display panel of claim 5, wherein the transparent conductive organic composite film comprises composite ink of poly(3,4-ethylenedioxythiophene)/poly (4-styrenesulfonic acid).

7. The organic light emitting display panel of claim 1, wherein the light emitted by the light emitting layer of each of the plurality of pixel units is white light, and a color film layer is further disposed on a side, facing away from the substrate, of the second electrode.

8. The organic light emitting display panel of claim 1, wherein the light emitting layer comprises a hole injection layer, a hole transporting layer, a red light emitting layer, a green light emitting layer, a charge generating layer, a blue light emitting layer, an electron transporting layer and an electron injection layer which are arranged in sequence on a side, facing away from the substrate, of the first electrode.

9. The organic light emitting display panel of claim 1, wherein the panel comprises a silicon-based substrate.

10. The organic light emitting display substrate of claim 1, wherein the reflecting layer is an insulating layer, and is provided with via holes corresponding to the positions of the plurality of pixel units;
the organic light emitting display panel further comprises a thin film transistor array which drives the plurality of pixel units to emit light, wherein the thin film transistor array is arranged between the substrate and the reflecting layer, and each thin film transistor is connected with a transparent conducting layer of a pixel unit driven by the thin film transistor through a via hole which correspond to the position of the pixel unit.

11. The organic light emitting display panel of claim 1, wherein the reflecting layer is a conductive film layer and comprises a plurality of reflecting electrodes arranged at intervals, wherein each of the plurality of reflecting electrodes is in a one-to-one correspondence relationship with a pixel unit, and adjacent reflecting electrodes are separated through a retaining wall, which is the retaining wall between adjacent pixel units corresponding to adjacent reflecting electrodes.

12. The organic light emitting display panel of claim 1, wherein a material of the reflecting layer comprises aluminum.

13. The organic light emitting display panel of claim 1, wherein the first electrode is an anode layer, and the second electrode is a cathode layer.

14. A display device, comprising the organic light emitting display panel according to claim 1.

15. A manufacturing method of the organic light emitting display panel according to claim 1, comprising:
forming the reflecting layer on the substrate;
forming the retaining walls for separating the plurality of pixel units on the reflecting layer;
printing a corresponding amount of transparent conductive liquid within each of the plurality of pixel units defined by retaining walls through a manner of printing, wherein a film layer formed by the transparent conductive liquid is taken as the transparent conducting layer; and
forming in sequence the first electrode, the light emitting layer and the second electrode on the transparent conducting layer, wherein the second electrode semi-transparent and semi-reflective.

16. The manufacturing method of claim 15, wherein the step of forming the retaining walls for separating the plurality of pixel units on the reflecting layer particularly comprises: forming the retaining walls on the reflecting layer through a photolithographic process, wherein heights of the retaining walls in the direction vertical to the substrate are equal to a sum of a thickness of the transparent conducting layer of a red pixel unit and a preset value, and a preset value is 200 Å-500 Å.

17. The manufacturing method of claim 15, wherein the step of printing a corresponding amount of transparent conductive liquid within the each of the plurality of pixel units defined by retaining walls through a manner of printing particularly comprises:
calculating a quantity of drops of a transparent conductive liquid which is to be printed to each of the plurality of pixel units according to a thickness of a to-be-formed transparent conducting layer of each pixel unit; and
printing a corresponding quantity of drops of the transparent conductive liquid within the pixel unit defined by retaining walls through a manner of printing.

18. The manufacturing method of claim 17, wherein the step of printing a corresponding quantity of drops of the transparent conductive liquid within the each of the plurality of pixel units defined by retaining walls particularly comprises:
printing a corresponding quantity of drops of composite ink of poly(3,4-ethylenedioxythiophene)/poly(4-styrenesulfonic acid) within the each of the plurality of pixel units defined by retaining walls.

* * * * *